(12) United States Patent
Abe et al.

(10) Patent No.: US 7,575,698 B2
(45) Date of Patent: Aug. 18, 2009

(54) TI AND W CONTAINING TRANSPARENT OXIDE ELECTRODE FILM

(75) Inventors: Yoshiyuki Abe, Ichikawa (JP); Noriko Ishiyama, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 12/345,934

(22) Filed: Dec. 30, 2008

(65) Prior Publication Data
US 2009/0127519 A1 May 21, 2009

Related U.S. Application Data

(62) Division of application No. 10/677,849, filed on Oct. 2, 2003, now Pat. No. 7,507,357.

(30) Foreign Application Priority Data

| Oct. 4, 2002 | (JP) | 2002-292434 |
| Dec. 11, 2002 | (JP) | 2002-359975 |
| Sep. 17, 2003 | (JP) | 2003-324825 |

(51) Int. Cl.
  *H01B 1/08* (2006.01)
  *H01L 31/00* (2006.01)
  *H01L 31/0224* (2006.01)
(52) U.S. Cl. .................. 252/520.21; 204/192.15; 204/192.29; 136/258; 250/214.1
(58) Field of Classification Search .......... 252/520.21; 204/192.15, 192.29; 136/256; 250/214.1
See application file for complete search history.

(56) References Cited

U.S. PATENT DOCUMENTS

| 7,141,186 B2 | 11/2006 | Abe et al. |
| 2003/0218153 A1 | 11/2003 | Abe |
| 2004/0164281 A1 * | 8/2004 | Abe et al. ............ 252/500 |
| 2007/0057239 A1 * | 3/2007 | Abe et al. ............ 252/520.2 |

FOREIGN PATENT DOCUMENTS

| DE | 19654717 | 7/1997 |
| EP | 0686982 | 12/1995 |
| EP | 0793277 | 9/1997 |
| EP | 1174390 | 1/2002 |
| JP | 59-204625 | 11/1984 |
| JP | 59204625 | 11/1984 |

(Continued)

OTHER PUBLICATIONS

John L. Vossen, "RF Sputtered Transparent Conductors The System in 2 O 3 SnO 2. RCA Laboratories", RCA Review vol. 32 pp. 289-296, Jun. 1971.

(Continued)

*Primary Examiner*—Mark Kopec
(74) *Attorney, Agent, or Firm*—Katten Muchin Rosenman LLP

(57) ABSTRACT

A transparent oxide electrode film is provided to have crystalline indium oxide as its main component in which the indium in the indium oxide is substituted with titanium at a titanium/indium atomic ratio between 0.003 and 0.120, and the resistivity of the transparent oxide electrode film is $5.7 \times 10^{-4}$ $\Omega$cm or less, so as to provide excellent transmittance for both the visible light region and the infrared light region, and low resistivity.

8 Claims, 4 Drawing Sheets

FOREIGN PATENT DOCUMENTS

| | | |
|---|---|---|
| JP | 2-309511 | 12/1990 |
| JP | 5-102499 | 4/1993 |
| JP | 5-218479 | 8/1993 |
| JP | 6-349338 | 12/1994 |
| JP | 7-054132 | 2/1995 |
| JP | 7054132 | 2/1995 |
| JP | 7335031 | 12/1995 |
| JP | 8-43840 | 2/1996 |
| JP | 9-055526 | 2/1997 |
| JP | 9-161542 | 6/1997 |
| JP | 9-199741 | 7/1997 |
| JP | 9-209134 | 8/1997 |
| JP | 9-282945 | 10/1997 |
| JP | 11-145493 | 5/1999 |
| JP | 11-214737 | 8/1999 |
| JP | 2001-127336 | 5/2001 |
| JP | 2001-304955 | 10/2001 |
| JP | 2002-50231 | 2/2002 |
| JP | 2002-200534 | 7/2002 |
| JP | 2004-043851 | 2/2004 |
| JP | 2004043851 | 2/2004 |
| JP | 2006-193363 | * 7/2006 |

OTHER PUBLICATIONS

Katsufusa Shono, "Physics-Engineering Experiments." Semiconductor Technology First Volume. University of Tokyo Press May 17, 1976.

"Transparent Conducting Film Technology", Japan Society for the Promotion of Science, Ohm Co. pp. 55-57.

R. Groth, "Investigation of Semiconductor Indium Oxide Films", 1966, pp. 69-75, Physica Status Solidi, Phillips Zentrallaboratorium GmbH, Aachen, Germany.

A.E. Delahoy, et al., "Transparent and Semitransparent Conducting Film Deposition by Reactive-Environment, Hollow Cathod Sputtering", Journal of Vacuum Science and Technology A. Vacuum, Surfaces and Films, Jun. 28, 2005, pp. 1215-1220, vol. 23, No. 4, American Institute of Physics, New York, NY.

I. Safi, et al., "The Properties of Reactively-Sputtered, Stoichometry-Controlled and Optimum-Conductivity Transparent Indium Oxide Films as a Function of their Titanium, Aluminum and Zinc Content Comparisons with the Use of Tin as a Dopant", Apr. 1999, vol. 343-344, pp. 115-118, Dept. of Physics, Loughborough University, Loughborough, UK.

G. Campet, et al., "The Electronic Effect of TI4+, ZR4+ and GE4+ Dopings Upon the Physical Properties of IN203 and SN-Doped IN203 Ceramics; Application to New Highly-Transparent Conductive Electrodes", Jun. 20, 1993, pp. 285-289, vol. B19, No. 3, Lausanne, Ch.

E. Husenov, et al., "IR-Detectors Based on IN203-Anode Oxide-CdxHg1-xTe" International Journal of Infrared and Millimeter Waves, Sep. 2002, vol. 23, No. 9, pp. 1337-1345, Plenum Publishing Corporation, US.

F.L. Sutherland, et al., "Preparation and Properties of Transparent Conducting Film of ZnO and In203", Sep. 1, 1988, pp. 172-175, vol. 3, No. 3, Chemtronics, Butterworth Scientific Ltd., Guildford, GB.

K.L. Chopra, et al., "Transparent Conductors A Status Review", Jan. 1983, vol. 102, pp. 1-46, Elsevier-Sequoia, The Netherlands.

Summons to Attend Pursuant to Rule 115(1) EPC dated Dec. 28, 2007 for corresponding European Application EP 03 256 274.

European Search Report and Annex to the European Search Report dated Mar. 8, 2006, for corresponding European Application EP 03 256 274.

European Search Report dated Sep. 11, 2008, for corresponding European Application.

* cited by examiner

TI AND W CONTAINING TRANSPARENT OXIDE ELECTRODE FILM

This application is a DIV of Ser. No. 10/677,849 (filed Oct. 2, 2003, now U.S. Pat. No. 7,507,357).

TECHNICAL FIELD OF THE INVENTION

The present invention relates to a transparent oxide electrode film with low resistance and high transmittance, and a transparent conductive base material, solar cell and photo detection element using this transparent oxide electrode film.

BACKGROUND OF THE INVENTION

Transparent oxide electrode films have both high conductivity, and high transmittance of the visible light spectrum. Consequently, transparent oxide electrode films are used as the electrodes in solar cells, liquid crystal display elements, and various other photodetectors. In particular, transparent oxide electrode films formed using sputtering targets or ion plating tablets which can form transparent oxide electrode films with low resistance and high transmittance, can make sufficient use of solar energy, and are suitable for use in solar cells.

Widely used varieties of transparent oxide electrode films include tin oxide ($SnO_2$) films doped with antimony or fluorine, zinc oxide (ZnO) films doped with aluminum or gallium, and indium oxide ($In_2O_3$) films doped with tin. Indium oxide films doped with tin, that is $In_2O_3$:Sn films, are referred to as ITO (Indium Tin Oxide) films, and are particularly widely used because of the ease of obtaining a low resistance film.

Because these films are transparent oxide electrode films which have high carrier electron concentration, and excellent reflection and absorption characteristics for near infrared wavelengths, they are also used as heat reflecting film for car window glass or building window glass, as a variety of antistatic coatings, and as transparent heating elements for defogging freezing display cases and the like.

Frequently used methods for manufacturing the transparent oxide electrode films mentioned above include sputtering methods and evaporation methods, ion plating methods, and methods involving the application of a transparent conductive layer formation coating. In particular, sputtering methods and ion plating methods are effective when forming a film on a film deposition material (referred to simply as the "substrate" below) using a material with low vapor pressure, or when precise film thickness control is required, and are widely used because of their extreme ease of operation.

In a sputtering method, generally a film is formed by causing a glow discharge to occur between the substrate acting as the anode and a target acting as the cathode, under an argon gas pressure below approximately 10 Pa, to generate argon plasma, and then causing the positive argon ions within the plasma to strike the cathode target, thereby ejecting particles of the target component, and causing these particles to be deposited on the substrate.

Sputtering methods are classified according to the method used to generate argon plasma, and those methods which use RF plasma are called RF sputtering methods, while those using direct current plasma are called DC sputtering methods. Furthermore, methods in which a film is deposited by providing a magnet behind the target and concentrating argon plasma directly onto the target, to raise the collision efficiency of the argon ions even under low pressure, are called magnetron sputtering methods. Normally, a DC magnetron sputtering method is used to manufacture the transparent oxide electrode films described above. Furthermore, sometimes plasma obtained by superposing radio frequency on a base direct current plasma is used. This is called RF superimposed DC sputtering, and enables the discharge voltage to be lowered RF superimposed DC sputtering is often used when creating an oxide film using an oxide target. Because sputtering can be performed at a low discharge voltage, the bombardment of the film by oxygen ions produced from the target can be minimized, and a good quality film can be obtained.

Here, solar cells comprise p-type and n-type semiconductors in a layered structure, and are broadly classified according to the type of semiconductor. The most commonly used type of solar cell uses silicon, which is both safe, and abundant in terms of natural resources. There are three types of solar cells using silicon, those using single cell silicon, polysilicon and amorphous silicon. Furthermore, development is proceeding in the field of solar cells known as compound thin film solar cells, which use thin films of compound semiconductors such as $CuInSe_2$, GaAs and CdTe and the like. Some examples are as disclosed in JP Patent Publication No. Tokukai Hei 5-218479, JP Patent Publication No. Tokukai Hei 9-55526 and JP Patent Publication No. Tokukai Hei 11-145493, and the like. Regardless of the type of solar cell, it is essential that a transparent oxide electrode film be provided as an electrode on the side of the solar cell from which sunlight enters, and conventionally, an ITO film or a zinc oxide (ZnO) film doped with aluminum or gallium or the like has been used.

The following is a detailed description of the compound thin film solar cells mentioned above. The structure of a solar cell which uses a compound thin film is that of a heterojunction of a compound semiconductor thin film with a wide band gap (an n-type semiconductor middle layer) and a compound thin film with a narrow band gap (a p-type semiconductor light absorbing layer). Normally, because of the scarcity of p-type semiconductor thin films with a wide enough band gap (>2.4 eV) for use as the middle layer of a solar cell, and because of the longer minority carrier diffusion length for electrons, an n-type semiconductor is used as the middle layer and a p-type semiconductor is used as the absorbing layer. The p-type semiconductors which can be used as the light absorbing layer include $CuInSe_2$, $CuInS_2$, $CuGaSe_2$, $CuGaS_2$ and solid solutions of these compounds, and CdTe. The conditions required to obtain higher energy conversion efficiency are an optimal optical design allowing a greater number of photoelectric currents to be obtained, and the creation of high quality hoterojunctions and thin films where carrier recombination does not occur at the interface and specifically at the absorbing layer. Whether or not a high quality heterointerface is obtained depends largely on the combination of middle layer and absorbing layer, and useful heterojunctions are obtained with CdS/CdTe based, $CdS/CuInSe_2$ based and $CdS/Cu(In, Ga)Se_2$ based layers and the like. Furthermore, the use of a semiconductor with a wider band gap such as CdZnS as the semiconductor thin film of the middle layer in an attempt to increase the efficiency of a solar cell has yielded an improvement in sensitivity to the short wavelength light in sunlight. In addition, a high performance solar cell has been proposed which has high reproducibility due to the placement on the light incident side of a CdS or (Cd, Zn)S thin film, of a semiconductor with a larger band gap than that thin film, for example a ZnO or (Zn, Mg)O thin film, as a widow layer. Conventionally, ITO films, and zinc oxide (ZnO) films doped with aluminum or gallium or the like are employed as the transparent oxide electrode film used as the electrode on the light incident side of the cell.

The properties required of the transparent oxide electrode film used here are low resistance and high transmittance of sunlight. The spectrum of sunlight includes light ranging from 350 nm ultraviolet rays to 2500 nm infrared rays, and in order to effectively convert these forms of light energy into electrical energy, a transparent oxide electrode film is required which can transmit as wide a wavelength range as possible.

The following is a detailed description of the photo detection element. It is necessary to detect weak light for the advancement of optical communication techniques, medical diagnostics and environmental instrumentations. The detection of weak light is also required in the field of the detection of bioluminescence, the photochemical analysis of microdose agent in blood and the like, in addition to the precise spectrum analysis and the astronomic observation. In the prior art, the detection of weak light has been mainly used for the detection in and around the visible light region, however, its demand increases for the detection in the near-infrared-light region. Any of the light emission (wave length: 1.3 μm) of active oxygen, its movement in vivo being worthy of notice, the low-loss region of optical fiber (wavelength: 1.3 μm band or 1.55 μm band) and the safe region of laser wavelength to eyes (wavelength at least 1.4 μm) is the near-infrared-light region, and a variety of photo detection elements for weak infrared light is developed vigorously.

The wavelength used in the communication using optical fiber is in the infrared light region and the infrared light source of 1.3 μm band and 1.55 μm band is mainly used, and therefore photo detection elements of high-performance for infrared light are required to simultaneously detect the infrared light having such wave lengths. Generally, the photo detection element has a structure wherein the layer of photo detection materials is interposed between a pair of electrodes. As the layer of infrared photo detection materials, there are a type using Gc or InGeAs based semi-conductor materials, i.e. photodiode (PD) or avalanche photodiode (APD), the other type using materials wherein at least one element selected from the group of Eu, Ce, Mn and Cu, and at lease one element selected from the group of Sm, Bi and Pb are added to alkaline-earth metal sulfide or selenide as disclosed in JP Patent Publication No. Tokukai Hei 5-102499. APD using the multi-layered structure amorphous silicon-germanium and amorphous silicon is disclosed in JP Patent Publication No. Tokukai 2001-127336. A transparent electrode is used as an electrode on the light incident side of the photo detection element, and an ITO film has been used for it (e.g. JP Patent Publications Nos. Tokukai Hei 5-102499, Tokukai Hei 11-214737, Tokukai 2001-127336).

Generally, when light enters a substance, part of the light is reflected, part of the remainder is absorbed into the substance, and the rest is transmitted through the substance. $In_2O_3$ type and ZnO type transparent conductive materials are known as n-type semiconductors, in which carrier electrons are present, the movement of which contributes to electrical conduction. The carrier electrons in these transparent oxide electrode films reflect and absorb infrared rays. Increasing the carrier electron concentration in the film increases the reflection and absorption of infrared rays ("Transparent Conducting Film Technology", Japan Society for the Promotion of Science, Ohm Co. Pages 55 to 57). That is, an increase in the carrier electron concentration results in a decrease in the transmission of infrared rays. So as not to decrease the transmission of infrared rays whose wavelength is 1000-1400 mm, the carrier electron concentration should be less than $5.5 \times 10^{20}$ $cm^{-3}$, and preferably less than $4.0 \times 10^{20}$ $cm^{-3}$.

Because the carrier electron concentrations of the conventionally used ITO films and zinc oxide (ZnO) films mentioned above are higher than $1 \times 10^{21}$ $cm^{-3}$, they have low resistance, but they absorb and reflect infrared rays above 1000 nm, letting hardly any through.

Furthermore, generally, the resistivity ρ of a substance depends on the product of the carrier electron concentration n and the carrier electron mobility μ ($1/\rho = en\mu$ where e is the elementary charge). In order to improve the transmittance of infrared rays, there should be as few carrier electrons as possible, but in order to minimize the resistivity ρ, the carrier electron mobility μ must be large.

The carrier electron mobility of low resistance oxide electrode films made from conventional materials is approximately 20 to 30 $cm^2$/Vsec in the case of ITO film, for example. The carrier electron mobility in n-type semiconductors such as indium oxide ($In_2O_3$) based semiconductors is said to be governed mainly by ionized impurity scattering and neutral impurity scattering and the like (impurities included in ion form are called ionized impurities, and impurities included in a neutral form with excess oxygen adhered around the periphery are called neutral impurities). If a large volume of impure elements is added to increase the number of carrier electrons, the carrier electrons are scattered, reducing the carrier electron mobility.

Even with materials such as ITO, it is possible to reduce the number of carrier electrons and improve the infrared ray transmittance by using deposition methods for reducing oxygen deficiency, in which an increased amount of oxygen is introduced during sputtering. However, the use of this method causes an increase in neutral impurities, and a reduction in carrier electron mobility occurs as a result, causing the electrical resistivity to rise.

The use of indium oxide films doped with titanium as transparent oxide electrode films is long known in the art. For example, the oldest such instance is in the document (RCA Review, 1971 Volume 32, pages. 289 to 296) written by J. L. Vossen. This document centers on the properties of ITO films formed by RF sputtering, but also mentions an example of the manufacture of an $In_2O_3$ with 20 mol % of $TiO_2$ added as impurities other than tin. However, the composition of this film differs markedly from the film composition of the present invention, and the electrical resistivity (resistivity) of the film is remarkably high at $7.5 \times 10^{-1}$ Ωcm.

Furthermore, a method of manufacturing an indium oxide film containing titanium on a polyethylene terephthalate film by means of a sputtering method using an indium oxide target containing 5 mass % titanium oxide is disclosed in JP Patent Publication No. Tokukai Sho 59-204625. However, because organic polymer materials like polyethylene terephthalate melt when heated to over 70° C., specifically over the glass transition temperature, deposition by sputtering can only be performed at substrate temperatures less than 70° C., and the structure of films made under such conditions is either amorphous or amorphous with a partial crystalline phase. Although an assumption is made that if there are amorphous sections within the film then the carrier electron mobility for the film is low, this publication has no disclosure relating to carrier electron concentration, carrier electron mobility, and infrared ray transmittance.

An indium oxide target containing titanium and the characteristics of a film created from this target using a sputtering method are disclosed in JP Patent Publication No. Tokukai Hei 9-209134. The object in this publication is to provide an oxide electrode film with high resistivity for use in touch panels, and in the examples are described oxide indium films containing titanium which have high resistivity, between 1.0×

$10^{-3}$ and $9.4 \times 10^{-3}$ Ωcm. Furthermore, the indium oxide film containing titanium which has the lowest resistivity of those in the comparative examples has resistivity of $0.6 \times 10^{-3}$ Ωcm. The resistivity for either case is quite high.

There are several patent applications relating to film materials based on ITO to which titanium is added. However, these are clearly distinguishable from the film of the present invention in that they contain tin. In other words, it is conventionally known that when tin is included in an indium oxide film, a large number of carrier electrons are released, and as such the carrier electrode concentration is high, allowing only films with low transmittance of the infrared light region to be obtained. For example, an indium oxide film containing titanium and tin for use in touch panels is disclosed in JP Patent Publication No. Tokukai Hei 9-161542. However, the resistivity as described in this publication is high at $9.6 \times 10^{-4}$ Ωcm.

Furthermore, a film of ITO or of indium oxide to which titanium is added is also disclosed in JP Patent Publication No. Tokukai Hei. 6-349338. However, because polyethylene terephthalate, a molded organic polymer, is used as the substrate, the use of sputter deposition methods which involve heating is problematic. If sputter deposition is performed at temperatures low enough to not cause organic polymers to melt (less than 70° C.), normally only a completely amorphous film structure or an amorphous structure including a partial crystal phase can be obtained, which is clearly different from a crystalline film. Furthermore, the sheet resistance and the film thickness are disclosed, but the resistivity calculated from these values (resistivity=sheet resistance×film thickness) is a high value.

An ITO sintered body target (10 mass % $SnO_2$) to which 50 to 500 ppm of Ti is added in order to raise the density of the sintered body is described in JP Patent Publication No. Tokukai Hei. 7-54132, and also described therein is an oxide electrode film with low resistance of between $1.7 \times 10^{-4}$ Ωcm and $2.9 \times 10^{-4}$ Ωcm manufactured by performing sputtering using this target while heating the substrate to between 100 and 300° C. However, there is no disclosure referring to the carrier electron concentration, carrier electron mobility or infrared light transmittance of this film, but an assumption can be made that because an ITO based material is used, most of the added elements which contribute to carrier electron production are tin, and the carrier electron concentration is high in line with conventional ITO, and consequently the infrared light transmittance is low.

On the other hand, the inventors of the present invention have proposed an indium oxide material containing tungsten as an indium oxide based transparent oxide electrode film with high transmittance of infrared light, in Japanese Patent Application No. 2002-200534. In this application, a case is disclosed in which an transparent oxide electrode with high infrared light transmittance and low resistance is manufactured with the substrate temperature between 200° C. and 300° C. It is shown that when the transparent oxide electrode film as disclosed in this application is deposited at low temperatures, for example 100° C. or 150° C., the resistivity is increased. In the manufacture of transparent oxide electrode film by means of a sputtering method, because a shortening of the heating time and a reduction in the electric power used to heat the substrate can be realized by using lower substrate temperatures, there remains problems with this invention in terms of manufacturing costs and productivity.

However, a low resistance indium oxide containing both titanium and tungsten has not been reported to date.

Although the ITO films and zinc oxide (ZnO) films described above have low resistance and high transmittance in the visible light region, their transmittance in the infrared light region is low, and the solar cells using these films as an electrode on the light incident side is not sufficient to use the solar energy in the infrared light region. Moreover, the same phenomenon can be said on the photo detection elements, and the rate of the infrared light entering in the layer of photo detection materials is low and the sensibility consequently becomes wrong in the conventional photo detection elements in which the ITO films and zinc oxide (ZnO) films described above are used as an electrode on the light incident side. Because the reflection and absorption of infrared light by a transparent oxide electrode film increases the higher the carrier electron concentration becomes, it is thought that the reason for the low transmittance of the infrared spectrum of these ITO films and zinc oxide (ZnO) films is that as the converse effect of the low resistance, the carrier electron concentration is high.

SUMMARY OF THE INVENTION

An object of the present invention is to provide a transparent oxide electrode film to solve the above problems, which has excellent transmittance not only in the visible light region but also in the infrared light region, and low resistance.

Furthermore, it is another object of the present invention is to use the transparent oxide electrode film according to the present invention in a solar cell, so that highly efficient use of the solar energy in the infrared light region, which was not possible conventionally, becomes possible.

Moreover, it is another object of the present invention is to use the transparent oxide electrode film according to the present invention as an electrode on the light incident side in a photo detection element, so that the infrared light can be carried into the layer of photo detection materials without damping within the entrance electrode which the role as electrode is achieved, and therefore a photo detection element available to detect weaker infrared light in comparison with in the prior art can be realized.

PREFERRED EMBODIMENTS OF THE INVENTION

Figure 1:
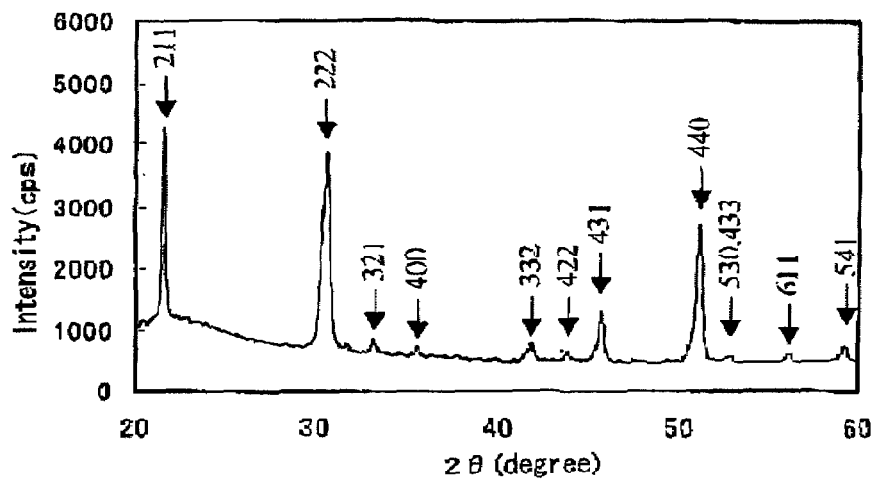
FIG. 1 is a graph showing an X-ray diffraction pattern of a transparent oxide electrode film according to example 5.

In order to achieve the above objects, a transparent oxide electrode film according to the present invention has the following structure.

Specifically, a transparent oxide electrode film according to a first aspect of the present invention has as its main component indium oxide containing titanium, the indium oxide is crystalline, indium in the indium oxide is substituted with titanium at a titanium/indium atomic ratio of 0.003 to 0.120, and a resistivity of the transparent oxide electrode film is $5.7 \times 10^{-4}$ Ωcm or less.

It is desirable that tin element, an impurity, is substantially not contained in the indium oxide because a large amount of carrier elections is inclined to be produced by the existence of the tin element.

More preferably, the titanium/indium atomic ratio is between 0.003 and 0.050, and the resistivity of the transparent oxide electrode film is $4.0 \times 10^{-4}$ Ωcm or less A transparent oxide electrode according to a second aspect of the present invention has as its main component indium oxide containing titanium and tungsten, the indium oxide is crystalline, and indium in the indium oxide is substituted with titanium and tungsten at a ratio which when the titanium/indium atomic ratio is deemed x and the tungsten/indium atomic ratio is deemed y, satisfies an equation (1), $$0.019 - 1.90x \leq y \leq 0.034 - 0.28x \quad (1)$$

and the resistivity is $5.7 \times 10^{-4}$ Ωcm or less

It is desirable that tin element, an impurity, is substantially not contained in the indium oxide because a large amount of carrier elections is inclined to be produced by the existence of the tin element.

More preferably, when the titanium/indium atomic ratio is deemed x and the tungsten/indium atomic ratio is deemed y, the ratio satisfies an equation (2), $$0.019 - 1.27x \leq y \leq 0.034 - 0.68x \quad (2)$$

and the resistivity is $3.8 \times 10^{-4}$ Ωcm or less.

Preferably in the transparent oxide electrode film of the present invention, an average light transmittance for wavelengths between 1000 nm and 1400 nm is greater than 60%.

Preferably in the transparent oxide electrode film of the present invention, the carrier electron concentration given by Hall effect measurement is $5.5 \times 10^{20}$ cm$^{-3}$ or less, more preferably $4.0 \times 10^{20}$ cm$^{-3}$ or less. Preferably in the transparent oxide electrode film of the present invention, the carrier electron mobility given by Hall effect measurement is 40 cm$^2$/Vsec or greater, further preferably 60 cm$^2$/Vsec or greater, and more preferably 70 cm$^2$/Vsec or greater.

Furthermore, preferably the transparent oxide electrode film of the present invention is deposited by a sputtering method using either a sputtering target manufactured from an oxide sintered body for which the constituent elements are substantially indium, titanium and oxygen, or a sputtering target manufactured from an oxide sintered body for which the constituent elements are substantially indium, titanium, tungsten and oxygen, at a substrate temperature of 100° C. or higher, using a mixed gas of argon and oxygen containing at least 0.25% oxygen as the sputtering gas.

Furthermore, in a transparent electroconductive base material of the present invention, the aforementioned transparent oxide electrode film is formed on a transparent substrate.

It is desirable that the average light transmittance in the wave length range from 1000 mm to 1400 mm is at least 60%, and the surface resistance is up to 30 Ω/□.

The present invention provides a highly efficient solar cell using the transparent oxide electrode film which has low resistance and excellent transmittance not only in the visible region but also in the infrared light region. The term solar cell as used here includes silicon solar cells using single crystal silicon, polysilicon and amorphous silicon, solar cells using compound semiconductors such as $CuInSe_2$, $Cu(Ga, In)Se_2$, GaAs and CdTe, and dye-sensitization solar cells, but is not limited thereto.

The present invention provide a photo detection element for both visible light and infrared light using the transparent oxide electrode film which has low resistance and excellent transmittance in the infrared light region. That is a photo detection element comprising a pair of electrodes and a layer of photo detection materials interposed between the said electrodes, wherein the transparent oxide electrode film of this invention is used as at least one of the said electrodes.

Embodiments of the present invention are further detailed.

The transparent oxide electrode film of the present invention can be deposited by a sputtering method or an ion plating method. In other words, in a sputtering method, using an indium oxide sintered body containing titanium as the sputtering target which provides the raw material, a substrate and the target are placed in a sputtering system, the substrate is heated to a predetermined temperature under an argon inert gas atmosphere containing oxygen gas, and by generating plasma between the substrate and the target by applying an electric field between the substrate and the target, a transparent oxide electrode film in which part of the indium in the indium oxide is substituted with titanium is formed on the substrate.

On the other hand, in an ion plating method, using an indium oxide sintered tablet containing titanium as the ion plating tablet which provides the raw material, a substrate and the tablet are placed in a copper hearth in an ion plating system, the substrate is heated to a predetermined temperature under an argon inert gas atmosphere including oxygen gas, and by causing the tablet to evaporate from the copper hearth using an electron gun and generating plasma in the vicinity of the substrate, the tablet vapor is ionized, and a transparent oxide electrode film in which part of the indium in the indium oxide is substituted with titanium is formed on the substrate.

Moreover, it is possible to change the amount of titanium contained in the film by changing the amount of titanium contained in the target or the tablet. The structure and the crystallinity of the transparent oxide electrode film manufactured at this time depend on such conditions as the amount of titanium contained in the film, the substrate heating temperature, the oxygen partial pressure in the inert gas atmosphere, and the deposition speed.

In order to manufacture the crystalline transparent oxide electrode film of the present invention, it is necessary to heat the substrate temperature (between 100° C. and 350° C., for example).

Furthermore, it is possible to obtain a crystalline transparent oxide electrode film with indium oxide as its main component, in which part of the indium in the indium oxide is substituted with titanium and tungsten, by using the same sputtering method as above with an indium oxide sintered body target containing titanium and tungsten. This method is only one example, but a crystalline transparent oxide electrode film having indium oxide as its main component and containing titanium and/or tungsten, that is the transparent oxide electrode film of the present invention, can be obtained in this manner.

The inventors of the present invention formed transparent oxide electrode films with various compositions using a sputtering method or ion plating method based on the methods above, and investigated the composition, structure, electrical characteristics and optical characteristic of each.

As a result, it was discovered that by manufacturing either a crystalline transparent oxide electrode film with indium oxide as its main component in which the indium in the indium oxide is substituted with titanium at a titanium/indium atomic ratio between 0.003 and 0.120, or a crystalline transparent oxide electrode film with indium oxide as its main component in which the indium in the indium oxide is substituted with titanium and tungsten at a ratio which satisfies the formula $0.019-1.90x \leq y \leq 0.034-0.28x$ where x is the titanium/indium atomic ratio and y is the tungsten/indium atomic ratio, it is possible to realize a carrier electron concentration of $5.5 \times 10^{20}$ cm$^{-3}$ or less, which is lower than for conventional ITO films, and a low electrical resistivity between $1.9 \times 10^{-4}$ Ωcm and $5.8 \times 10^{-4}$ Ωcm.

More preferably, by manufacturing either a crystalline transparent oxide electrode film with indium oxide as its main component in which the indium in the indium oxide is substituted with titanium at a titanium/indium atomic ratio of 0.003 to 0.50, or a crystalline transparent oxide electrode film with indium oxide as its main component in which the indium in the indium oxide is substituted with titanium and tungsten at a ratio which satisfies the formula $0.019-1.27x \leq y \leq 0.034-0.68x$ where x is the titanium/indium atomic ratio and y is the tungsten/indium atomic ratio, a carrier electron concentration of $5.5 \times 10^{20}$ cm$^{-3}$ or less, which is lower than for conventional ITO films, and a low electrical resistivity between $1.9 \times 10^{-4}$ Ωcm and $4.0 \times 10^{-4}$ Ωcm can be realized.

It is apparent that because the carrier electron concentrations of these films is low at $5.5 \times 10^{20}$ cm$^{-3}$ or less and preferably $4.0 \times 10^{20}$ cm$^{-3}$ or less, they have high infrared light transmittance, with average light transmittance for the 1000 to 1400 nm wavelength range at 60%, and that due to their high carrier electron mobility these films have low resistance, and therefore a transparent oxide film is obtained with characteristics not found with conventional materials. Because a film with the above characteristics has extremely high transmittance in the infrared light region and low resistance, it is useful as a transparent electrode for a solar cell.

As described above, $In_2O_3$ based and ZnO based transparent conductive materials are known as n-type semiconductors, in which carrier electrons are present, the movement of which contributes to electrical conduction. The carrier electrons in these transparent oxide electrode films reflect and absorb infrared rays. In other words, an increase in the carrier electron concentration results in a decrease in the transmission of infrared rays. So as not to decrease the transmission of infrared rays, a carrier electron concentration of $5.5 \times 10^{20}$ cm$^{-3}$ or less, and more preferably $4.0 \times 10^{20}$ cm$^{-3}$ or less is required.

Because the carrier electron concentration of the transparent oxide electrode film of the present invention is low at $5.5 \times 10^{20}$ cm$^{-3}$ or less, as opposed to the carrier electron concentrations which are $1 \times 10^{21}$ cm$^{-3}$ or greater offered by conventional low resistance ITO films and zinc oxide (ZnO) films doped with aluminum or gallium, it has good transmission of infrared rays, and infrared rays greater than 1000 nm pass through the film without being absorbed or reflected by the film.

Furthermore, even though the carrier electron concentration of the oxide electrode film of the present invention is lower than that of conventional oxide electrode films, the carrier electron mobility is 40 cm$^2$/Vsec or greater, and under some manufacturing conditions, films with carrier electron mobility of 60 cm$^2$/Vsec and 70 cm$^2$/Vsec or greater can be realized, which is extremely high when compared to that in conventional low resistance oxide electrode films (approximately 20 to 30 cm$^2$/Vsec for an ITO film, for example), and consequently the electrical resistivity is equally as low as conventional low resistance oxide electrode films. Accordingly, the transparent oxide electrode film of the present invention is a material which shows high carrier electron mobility with a low carrier electron concentration, and therefore realizes high transmittance of infrared light in addition to visible light, and high electric conductivity.

The composition of the $In_2O_3$ film doped with 20 mol % of $TiO_2$ as described in the document written by J. L. Vossen (RCA Review, 1971 Volume 32, p. 289 to 296) differs significantly from the composition of the present invention, and the electrical resistivity of this film is extremely high at $7.5 \times 10^{-1}$ Ωcm, which differs clearly from the electrical resistivity of the film of the present invention.

Furthermore, the film formed on an organic polymer material with inferior heat resistance such as polyethylene terephthalate (glass transition temperature: about 70° C.) in JP Patent Publication No. Tokukai Sho 59-204625 differs clearly from the completely crystalline film formed using a sputtering method while heating the substrate to a temperature of 100° C. or greater, as in the present invention.

In addition, the resistivity of the film in JP Patent Publication No. Tokukai Hei 9-209134 is high at between $1.0 \times 10^{-3}$ Ωcm and $9.4 \times 10^{-3}$ Ωcm, and the resistivity of a comparative example therein is $0.6 \times 10^{-3}$ Ωcm, but both of these values are higher than the resistivity of the film of the present invention.

In addition, the resistivity of the indium oxide film in JP Patent Publication No. Tokukai Hei 9-161542 is high at greater than $9.6 \times 10^{-4}$, clearly differing from the film with resistivity lower than $5.7 \times 10^{-4}$ of the present invention.

In addition, because the film in JP Patent Publication No. Tokukai Hei 6-349338 uses an organic polymer mold of polyethylene terephthalate with inferior heat resistance as the substrate, it clearly differs from the crystal film of the present invention. Furthermore, the resistivity calculated from the sheet resistance and film thickness of the film (resistivity=sheet resistance×film thickness) is clearly higher than that of the present invention.

In addition, the oxide electrode film disclosed in JP Patent Publication No. Tokukai Hei 7-54132 which has low resistance between $1.7 \times 10^{-4}$ Ωcm and $2.9 \times 10^{-4}$ Ωcm is an ITO based material, where with the added elements, what contributies to carrier electron production is mainly tin, and as such an assumption can be made that this film has low transmittance for infrared light, and therefore has clearly different characteristics from the film of the present invention.

In addition, regarding the transparent oxide electrode film in Japanese Patent Application No. 2002-200534, if the film is deposited at a low temperature, for example 150° C., a film with good crystallinity cannot be obtained, and the resulting film has high resistivity. On the other hand, the transparent oxide electrode film according to the present invention enables a film with good crystallinity to be manufactured even when the substrate heating temperature during sputtering is set to a low temperature such as 100° C. or 150° C., allowing a film with low resistivity to be obtained. In the manufacture of an transparent oxide electrode film by a sputtering method, because a shortening of the heating time and a reduction in the electric power used to heat the substrate can be realized by using lower substrate temperatures, manufacturing costs can be reduced and productivity can be increased. Consequently, the transparent oxide electrode film of the present invention is extremely useful industrially.

As mentioned above, a transparent oxide electrode film with high transmittance in both the visible light region and the infrared light region, and low resistance of $5.8 \times 10^{-4}$ Ωcm or less, can be realized easily by having the indium oxide contain either titanium or titanium and tungsten within the composition range specified for the present invention, but this is difficult to achieve only by the composition range, and the film needs to be manufactured by deposition under suitable sputtering conditions. Specifically, it is essential that the oxygen content of the deposition gas during sputtering deposition, the gas pressure, and the substrate temperature be optimal.

For example, it is preferable that the distance between the target and the substrate is between 50 mm and 80 mm, and that the oxygen content of the deposition gas is between 0.25% and 4% of the argon gas volume. Furthermore, the deposition gas pressure is preferably between 0.3 Pa and 1.0 Pa. If the oxygen content of the deposition gas is less than 0.25%, there is a high degree of oxygen deficiency of the indium oxide phase, which results in the overproduction of carrier electrons, and therefore only a film with low transmittance of the infrared spectrum can be obtained. Furthermore, if the oxygen content is greater than 4%, excess oxygen is introduced around the periphery of the impure elements of titanium or tungsten in the indium oxide, causing the amount of neutral impurities to increase, and thereby reducing the carrier electron mobility, making it no longer possible to obtain a low resistance film as in the present invention.

The deposition gas pressure affects the kinetic energy of the sputtered particles which reach the substrate during sputtering. If the deposition gas pressure is lower than 0.3 Pa, then the kinetic energy of the sputtered particles is too high, causing re-sputtering of the film by these sputter particles, and giving the film an uneven surface. Furthermore, if the deposition gas pressure is higher than 1.0 Pa, the kinetic energy of the sputtered particles is too low, and the sputtered particles which reach the substrate do not migrate onto the substrate, resulting in a rough film with low density. Such a film has high grain boundary scattering of carrier electrons, and therefore high resistance. Accordingly, it is necessary to perform sputtering deposition at a deposition gas pressure which is preferably between 0.3 Pa and 1.0 Pa.

It is necessary for the substrate temperature to be between 100° C. and 350° C., as described above. By heating the substrate to between 100° C. and 350° C. during the sputtering process, it is possible to produce a completely crystalline film, in which either titanium or titanium and tungsten is substituted partially for the indium in the indium oxide and made into a solid solution, thereby obtaining a film with high carrier electron mobility and low resistivity. If the substrate temperature is below 100° C., the resulting film is partially amorphous, and a completely crystalline film cannot be obtained, and the titanium or the titanium and tungsten do not form a solid solution in the indium oxide, and a low resistance film with high carrier electron mobility as in the present invention is not obtained. Furthermore, it is possible to manufacture the transparent oxide electrode film of the present invention even at temperatures exceeding 350° C., but since more time is required for heating, this is not practical.

The present invention is described in further detail below using examples.

EXAMPLES

Manufacturing a Transparent Oxide Electrode Film

Examples 1 to 12

After mixing predetermined amounts of $In_2O_3$ powder and $TiO_2$ powder at a variety of ratios, and shaping the resulting mixture, heating and sintering was performed to manufacture indium oxide sintered bodies containing titanium. Indium oxide thin films containing titanium were then manufactured from indium oxide sintered body targets with varying titanium content, using a sputtering method. In other words, these sintered bodies were processed to 6 inches φ×5 mm thickness in size, and affixed using an indium alloy to a backing plate made of oxygen-free copper to produce a sputtering target.

The above sputtering target was attached to a non-magnetic target cathode in a DC magnetron sputtering system, and a silica glass substrate with a thickness of 1 mm was attached to the opposite side of the target. The distance between the target and the substrate was set to between 50 mm and 80 mm, and at the point when the degree of vacuum within the chamber fell below $1 \times 10^{-4}$ Pa, 99.9999 mass % pure argon gas was introduced into the chamber to obtain a gas pressure of 0.3 Pa to 0.8 Pa, between 0.25% and 4% oxygen was introduced into the deposition gas, and 350 W of DC power was applied between the target and the substrate, thereby generating a DC plasma and performing sputtering, and with the substrate heated to between 200° C. and 350° C., a transparent oxide electrode film with a film thickness of between 200 nm and 400 nm was formed.

Quantitative analysis of the composition of the thus obtained transparent oxide electrode film was performed by means of ICP emission spectrometry and an EPMA. The crystallinity of the film was examined by X-ray diffraction measurement with CuK α radiation. Furthermore, the resistivity, the carrier electron concentration and the carrier electron mobility of each of the transparent oxide semiconductors was determined by Hall effect measurement based on the Van der Pauw method (as disclosed in the document Physics-Engineering Experiments, Semiconductor Technology (first volume), Katsufusa Shono, University of Tokyo Press, p. 105, for example) using a Hall effect measurement system (manufactured by TOYO Corporation). In addition, the light transmittance was measured with the substrate included using a spectrophotometer (manufactured by Hitachi, Ltd.).

The average light transmittance of the glass substrate itself as used in examples 1 to 12 of the present invention for the visible light wavelength region was 92%. The light transmittance of the film itself was estimated.

The deposition conditions of the transparent oxide electrode films, and the results of measuring the composition, the resistivity and the carrier electron mobility of the transparent oxide electrode films are shown together in Table 1.

TABLE 1

|  | Substrate Temperature (°C.) | $O_2$ Content of Deposition Gas (%) | Film Ti/In Atomic Ratio | Resistivity ($\Omega$ cm) | Carrier Electron Concentration ($cm^{-3}$) | Carrier Electron Mobility ($cm^2$/Vsec) |
|---|---|---|---|---|---|---|
| Ex-1 | 200 | 1.0 | 0.003 | $3.5 \times 10^{-4}$ | $1.9 \times 10^{20}$ | 94 |
| Ex-2 | 250 | 1.0 | 0.006 | $4.0 \times 10^{-4}$ | $2.0 \times 10^{20}$ | 78 |
| Ex-3 | 300 | 1.0 | 0.010 | $3.9 \times 10^{-4}$ | $2.4 \times 10^{20}$ | 67 |
| Ex-4 | 250 | 1.0 | 0.015 | $2.5 \times 10^{-4}$ | $3.4 \times 10^{20}$ | 74 |
| Ex-5 | 200 | 1.0 | 0.018 | $2.3 \times 10^{-4}$ | $3.2 \times 10^{20}$ | 85 |
| Ex-6 | 200 | 1.0 | 0.019 | $1.9 \times 10^{-4}$ | $3.8 \times 10^{20}$ | 86 |
| Ex-7 | 200 | 0.5 | 0.028 | $2.6 \times 10^{-4}$ | $4.5 \times 10^{20}$ | 53 |
| Ex-8 | 250 | 1.5 | 0.044 | $2.3 \times 10^{-4}$ | $3.8 \times 10^{20}$ | 72 |
| Ex-9 | 200 | 5.0 | 0.050 | $3.5 \times 10^{-4}$ | $4.1 \times 10^{20}$ | 44 |
| Ex-10 | 200 | 0.5 | 0.061 | $2.8 \times 10^{-4}$ | $5.5 \times 10^{20}$ | 41 |
| Ex-11 | 200 | 1.0 | 0.092 | $5.7 \times 10^{-4}$ | $2.1 \times 10^{20}$ | 52 |
| Ex-12 | 350 | 1.2 | 0.119 | $3.8 \times 10^{-4}$ | $3.5 \times 10^{20}$ | 47 |

(Ex = Example)

Electrical Characteristics

It is apparent from Table 1 that transparent oxide electrode films based on indium oxide and containing titanium at a Ti/In atomic ratio of between 0.003 and 0.120 according to the present invention had a low carrier electron concentration of $5.5 \times 10^{20}$ $cm^{-3}$ or less, and had extremely low electrical resistivity of $5.7 \times 10^{-4}$ $\Omega$cm or less. The carrier electron mobility of most of the films was high at above 41 $cm^2$/Vsec, and it can therefore be said that low electrical resistivity was realized.

Furthermore, transparent oxide electrode films based on indium oxide and containing titanium at a Ti/In atomic ratio of 0.003 to 0.050 according to the present invention (examples 1 through 9) had a low carrier electron concentration at $4.5 \times 10^{20}$ $cm^{-3}$ or less, and had low electrical resistivity of at least $1.9 \times 10^{-4}$ $\Omega$cm and less than $4.0 \times 10^{-4}$ $\Omega$cm.

Crystallinity

It was apparent based on X-ray diffraction measurement that each of the transparent oxide electrode films of examples 1 through 12 had good crystallinity. The X-ray diffraction pattern of example 6 is shown in FIG. 1. Examples 1 through 5 and 7 through 12 also showed a strong diffraction peak corresponding with the crystal structure of indium oxide in the manner of FIG. 1, indicating that the films had the indium oxide bixbyte structure, which has good crystallinity, and because no peaks caused by crystal phases other than the indium oxide phase were observed, it was reasoned that the titanium had been substituted for the indium in the indium oxide, and had formed a solid solution.

Light Transmittance

Figure 2:
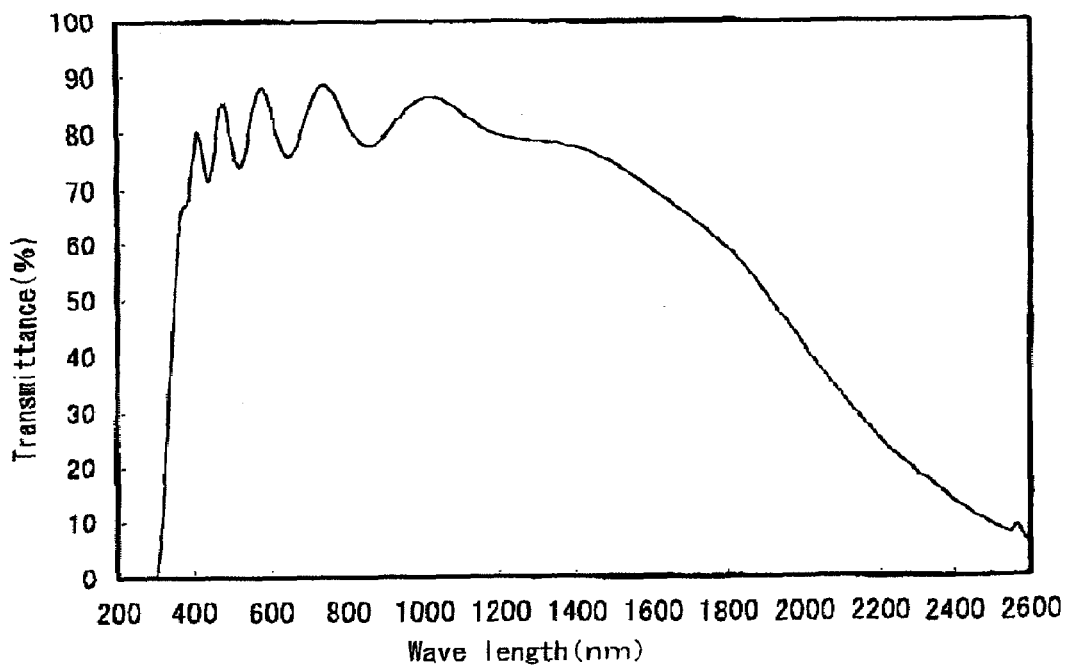
FIG. 2 is a graph showing the wavelength dependency of the transmittance when the transparent oxide electrode film according to example 5 is formed on a glass substrate.

Furthermore, the light transmission characteristics of the transparent oxide electrode film according to example 6 are shown in FIG. 2, and show extremely high light transmittance for the infrared light region in addition to the visible light region. The average light transmittance of the film itself for 1000 to 1400 nm wavelengths was 88%. This trend was common to the transparent oxide electrode films according to examples 1 through 5 and examples 7 through 12, which each had very high light transmittance for the infrared light region in addition to the visible light region. The average light transmittance of the films themselves for 1000 to 1400 nm wavelengths was greater than 72% in every case.

Moreover, by forming the transparent oxide electrode film according to Examples 1 to 12 of the present invention on a transparent or glass substrate, and by optimizing the film thickness and substrate material, an excellent transparent electroconductive base material is realized wherein the surface resistance is up to 30$\Omega$/□ and the average light transmittance is at least 70% in the wave length range from 1000 nm to 1400 nm.

Figure 6:
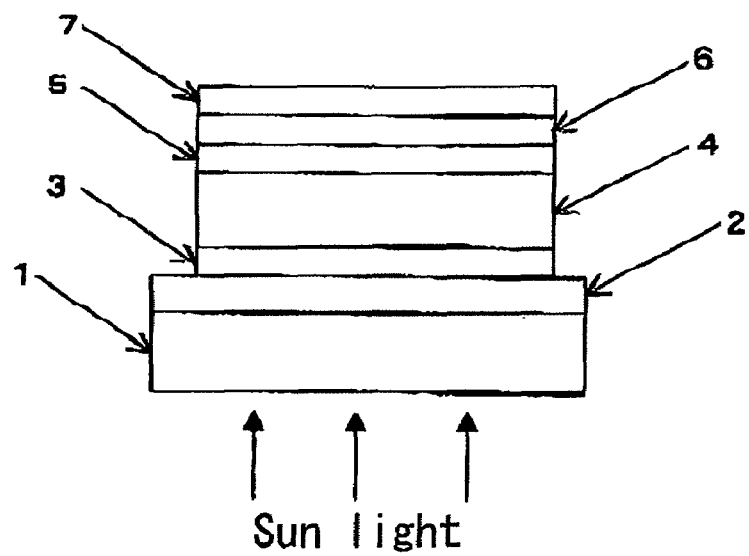
FIG. 6 is an explanatory diagram showing the general structure of a solar cell as an example of an application of the transparent oxide electrode film of the present invention.

Accordingly, if such transparent oxide electrode films are used as the surface transparent electrode film (2) on the light receiving side and/or the transparent electrode film (6) behind the p-n junction in a solar cell like that shown in FIG. 6, for example, solar energy in the infrared light region can be converted effectively to electrical energy.

Examples 13 to 37

Indium oxide sintered bodies containing both titanium and tungsten were obtained under the same conditions as examples 1 through 12 using $In_2O_3$ powder and $TiO_2$ powder and $WO_3$ powder as the raw materials. These sintered bodies were processed to 6 inches $\phi \times 5$ mm thickness in size, and affixed using an indium alloy to a backing plate made of oxygen-free copper to produce a sputtering target. Transparent oxide electrode films were formed on the glass substrate using the same methods as examples 1 through 12, and their characteristics were evaluated by the same processes. The results are shown in Table 2.

TABLE 2

|  | Substrate Temperature (°C.) | $O_2$ Content of Deposition Gas (%) | Film Ti/In Atomic Ratio | Film W/In Atomic Ratio | Resistivity ($\Omega$ cm) | Carrier Electron Concentration ($cm^{-3}$) | Carrier Electron Mobility ($cm^3$/Vsec) |
|---|---|---|---|---|---|---|---|
| Ex-13 | 300 | 1.5 | 0.002 | 0.019 | $3.2 \times 10^{-4}$ | $2.9 \times 10^{20}$ | 67 |
| Ex-14 | 250 | 1.5 | 0.002 | 0.029 | $3.7 \times 10^{-4}$ | $3.4 \times 10^{20}$ | 50 |
| Ex-15 | 350 | 2.0 | 0.004 | 0.023 | $3.9 \times 10^{-4}$ | $2.2 \times 10^{20}$ | 73 |

TABLE 2-continued

| | Substrate Temperature (°C.) | $O_2$ Content of Deposition Gas (%) | Film Ti/In Atomic Ratio | Film W/In Atomic Ratio | Resistivity ($\Omega$ cm) | Carrier Electron Concentration (cm$^{-3}$) | Carrier Electron Mobility (cm$^3$/Vsec) |
|---|---|---|---|---|---|---|---|
| Ex-16 | 200 | 1.0 | 0.012 | 0.005 | $1.9 \times 10^{-4}$ | $5.5 \times 10^{20}$ | 60 |
| Ex-17 | 250 | 3.0 | 0.012 | 0.015 | $2.2 \times 10^{-4}$ | $4.1 \times 10^{20}$ | 69 |
| Ex-18 | 200 | 0.5 | 0.016 | 0.022 | $2.1 \times 10^{-4}$ | $4.8 \times 10^{20}$ | 62 |
| Ex-19 | 200 | 0.3 | 0.024 | 0.002 | $3.0 \times 10^{-4}$ | $4.2 \times 10^{20}$ | 50 |
| Ex-20 | 250 | 1.5 | 0.024 | 0.016 | $2.8 \times 10^{-4}$ | $3.9 \times 10^{20}$ | 57 |
| Ex-21 | 200 | 1.5 | 0.040 | 0.006 | $3.8 \times 10^{-4}$ | $3.0 \times 10^{20}$ | 55 |
| Ex-22 | 250 | 1.0 | 0.002 | 0.033 | $4.1 \times 10^{-4}$ | $3.5 \times 10^{20}$ | 44 |
| Ex-23 | 250 | 3.0 | 0.004 | 0.013 | $4.3 \times 10^{-4}$ | $2.7 \times 10^{20}$ | 54 |
| Ex-24 | 200 | 2.5 | 0.008 | 0.005 | $4.2 \times 10^{-4}$ | $2.6 \times 10^{20}$ | 57 |
| Ex-25 | 200 | 1.5 | 0.012 | 0.001 | $4.8 \times 10^{-4}$ | $3.1 \times 10^{20}$ | 42 |
| Ex-26 | 250 | 1.5 | 0.012 | 0.030 | $5.1 \times 10^{-4}$ | $2.2 \times 10^{20}$ | 56 |
| Ex-27 | 250 | 1.0 | 0.024 | 0.027 | $4.4 \times 10^{-4}$ | $3.4 \times 10^{20}$ | 42 |
| Ex-28 | 200 | 1.5 | 0.032 | 0.013 | $4.3 \times 10^{-4}$ | $3.2 \times 10^{20}$ | 45 |
| Ex-29 | 250 | 1.5 | 0.040 | 0.009 | $4.5 \times 10^{-4}$ | $3.0 \times 10^{20}$ | 46 |
| Ex-30 | 200 | 1.5 | 0.040 | 0.021 | $4.5 \times 10^{-4}$ | $3.1 \times 10^{20}$ | 45 |
| Ex-31 | 200 | 4.0 | 0.048 | 0.002 | $4.5 \times 10^{-4}$ | $2.7 \times 10^{20}$ | 51 |
| Ex-32 | 200 | 2.0 | 0.060 | 0.002 | $4.3 \times 10^{-4}$ | $3.1 \times 10^{20}$ | 47 |
| Ex-33 | 250 | 3.0 | 0.060 | 0.017 | $5.1 \times 10^{-4}$ | $2.2 \times 10^{20}$ | 56 |
| Ex-34 | 250 | 1.5 | 0.072 | 0.004 | $4.8 \times 10^{-4}$ | $3.1 \times 10^{20}$ | 42 |
| Ex-35 | 250 | 1.5 | 0.092 | 0.008 | $5.2 \times 10^{-4}$ | $2.8 \times 10^{20}$ | 43 |
| Ex-36 | 250 | 1.5 | 0.101 | 0.002 | $5.7 \times 10^{-4}$ | $2.7 \times 10^{20}$ | 41 |
| Ex-37 | 250 | 1.0 | 0.116 | 0.001 | $5.6 \times 10^{-4}$ | $2.6 \times 10^{20}$ | 43 |

(Ex = Example)

Electrical Characteristics

It is apparent from Table 2 that transparent oxide electrode films based on indium oxide which contain titanium at a Ti/In atomic ratio x and tungsten at a tungsten/indium atomic ratio y satisfying Equation of $0.019-1.90x \leq y \leq 0.034-0.28x$ according to the present invention have a low carrier electron concentration of $5.5 \times 10^{20}$ cm$^{-3}$ or less, and extremely low electrical resistivity of $5.7 \times 10^{-4}$ $\Omega$cm or less. The reason that such low electrical resistivity is demonstrated despite the fact that the carrier electron concentration is low is because as shown in FIG. 2, the carrier electron mobility is extremely high.

Crystallinity

Based on X-ray diffraction measurement, the transparent oxide electrode films according to examples 13 through 37 presented similar diffraction patterns to that shown in FIG. 1 for example 6, indicating that the films had the indium oxide bixbyte structure, which has good crystallinity, and because no peaks caused by crystal phases other than the indium oxide phase were observed, it was reasoned that the titanium and tungsten had been substituted for the indium in the indium oxide, and had formed a solid solution.

Light Transmittance

Figure 3:
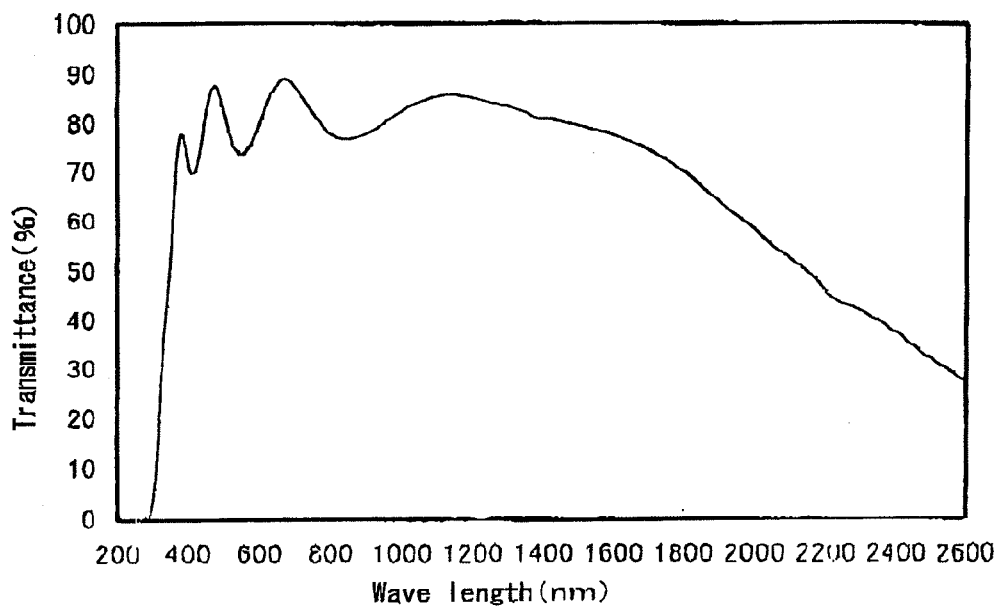
FIG. 3 is a graph showing the wavelength dependency of the transmittance when the transparent oxide electrode film according to example 17 is formed on a glass substrate.

The light transmission characteristics of the transparent oxide electrode film according to example 17 are shown in FIG. 3. It is apparent that this film had high transmittance not only for the visible light region but also for the infrared light region. This trend was common to the transparent oxide electrode films according to examples 13 through 16 and examples 18 through 37, which had very high light transmittance for the infrared light region in addition to the visible light region.

The average light transmittance of the transparent oxide electrode films according to examples 13 to 37 for 1000 nm to 1400 nm wavelengths, obtained by subtracting the transmittance of the substrate, was found to be between 66% and 89%. Accordingly, if such transparent oxide electrode films are used as the surface transparent electrode on the light receiving side and/or the transparent electrode behind the p-n junction in a solar cell like that shown in FIG. 6, for example, solar energy in the infrared light region can be converted effectively to electrical energy.

Comparative Examples 1 to 3

ITO transparent oxide electrode films were manufactured following the same method as examples 1 through 7, using indium oxide (ITO) sintered body targets containing tin (10 wt % SmO$_2$), as are often used conventionally. Evaluation of their characteristics was carried out by the same methods as in the examples. The results are shown in Table 3.

TABLE 3

| | Substrate Temperature (°C.) | $O_2$ Content of Deposition Gas (%) | Film Ti/In Atomic Ratio | Resistivity ($\Omega$ cm) | Carrier Electron Concentration (cm$^{-3}$) | Carrier Electron Mobility (cm$^2$/Vsec) |
|---|---|---|---|---|---|---|
| CE-1 | 300 | 1.0 | 0.075 | $1.3 \times 10^{-4}$ | $2.9 \times 10^{21}$ | 17 |
| CE-2 | 250 | 2.0 | 0.075 | $1.8 \times 10^{-4}$ | $1.1 \times 10^{21}$ | 32 |
| CE-3 | 150 | 1.0 | 0.075 | $2.4 \times 10^{-4}$ | $1.2 \times 10^{21}$ | 22 |

(CE = Comparative Example)

Crystallinity

It was apparent based on X-ray diffraction measurement that each of the transparent oxide electrode films of comparative examples 1 through 3 had good crystallinity.

Electrical Characteristics

It is apparent from Table 3 that although the resistivity of the conventional ITO films was low at $2.4 \times 10^{-4}$ Ωcm or less, the carrier electron concentration was high at $1.1 \times 10^{21}$ cm$^{-3}$ or more.

Light Transmittance

Figure 4:
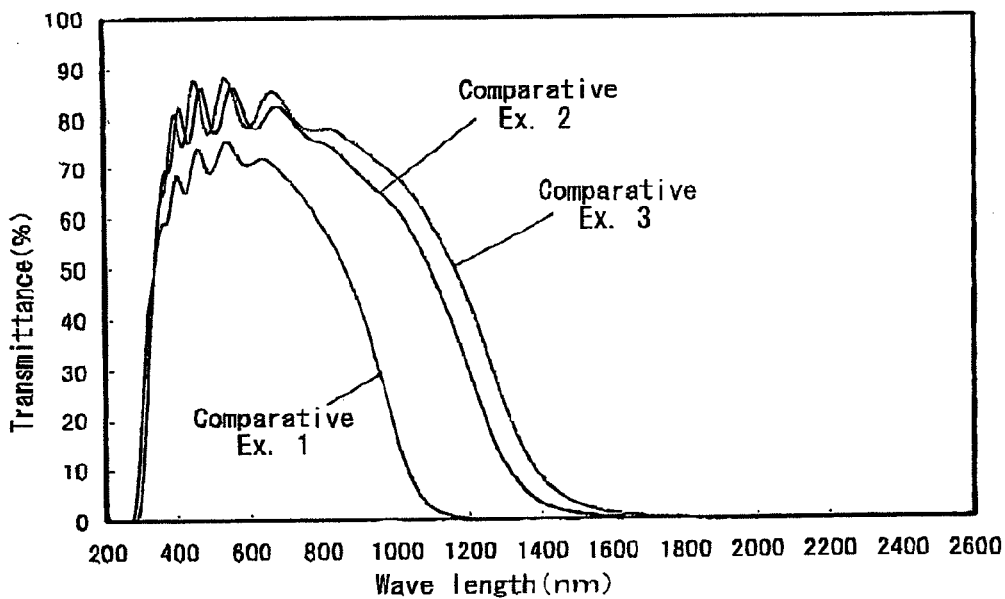
FIG. 4 is a graph showing the wavelength dependencies of the transmittance when the transparent oxide electrode films according to comparative examples 1 to 3 are formed on glass substrates.

The light transmission characteristics of the films according to conventional examples 1 through 3 are shown in FIG. 4, and a sharp decrease in transmittance in the infrared light region for wavelengths above 1000 nm can be seen due to the high carrier electron concentration, and therefore if such a film is used as the transparent electrode in a solar cell, solar energy in the infrared light region cannot be utilized effectively.

In the case of the transparent electro conductive base materials with the ITO film according to Comparative Examples 1 to 3 used in them, as a result of examination with the film thickness and substrate material varied in a broad range, it was impossible to realize the transparent electro-conductive base material wherein the surface resistance is up to 30Ω/□ and the average light transmittance in the wave length range from 1000 nm to 1400 nm is at least 70%.

Comparative Example 4

In the same manner, a transparent zinc oxide electrode film containing gallium was manufactured by the same methods as examples 1 through 8, with the exceptions that a zinc oxide sintered body target containing 3 atomic % gallium as is commonly used conventionally was used, argon gas only was used as the deposition gas, and the substrate temperature was set to 150° C.

Electrical Characteristics

When this film was evaluated in the same manner as the examples, the resistivity was $2.2 \times 10^{-4}$ Ωcm, the carrier electron concentration was $1.2 \times 10^{21}$ cm$^{-3}$, and the carrier electron mobility was 23 cm$^2$/Vsec.

Light Transmittance

Figure 5:
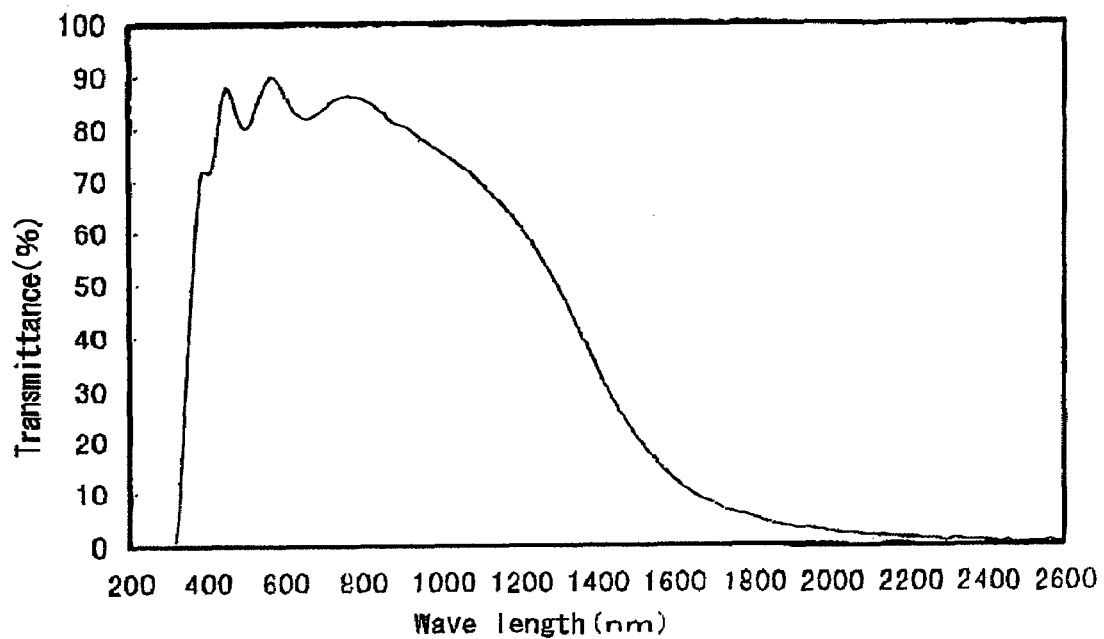
FIG. 5 is a graph showing the wavelength dependency of the transmittance when the transparent oxide electrode film according to comparative example 4 is formed on a glass substrate.

Furthermore, the transmission characteristics of this film are shown in FIG. 5, and it is clear based on the diagram that the light transmittance for wavelengths in the infrared light region above 1000 nm was markedly low.

Accordingly, if such a film is used as the transparent electrode on the light incident side of a solar cell, solar energy in the infrared light region cannot be utilized effectively.

Examples 38 to 46, Comparative Examples 5 to 7

Transparent oxide electrode films were manufactured by performing sputtering with the substrate temperature set to a low temperature of 150° C., using sintered body targets of indium oxide containing titanium, and indium oxide containing titanium and tungsten. The films were deposited onto a glass substrate under the same sputtering conditions as examples 1 to 12 except for the substrate temperature, and the characteristics of the resulting transparent oxide electrode films were evaluated according to the same procedure, the results of which are shown in Table 4.

Furthermore, as conventional examples 5 to 7, film deposition was carried out under the exact same sputtering conditions as examples 38 to 46, using a sintered body target of indium oxide containing tungsten but not titanium manufactured according to the same steps as in examples 1 through 12, thereby manufacturing the indium oxide film containing tungsten as disclosed in Japanese Patent Application No. 2002-200534. The film was deposited onto a glass substrate under the same sputtering conditions as examples 1 through 12 with the exception of the substrate temperature, and the characteristics of the resulting films were evaluated according to the same procedure, the results of which are shown in Table 4.

TABLE 4

| | Substrate Temperature (° C.) | O$_2$ Content of Deposition Gas (%) | Film Ti/In Atomic Ratio | Film W/In Atomic Ratio | Resistivity (Ω cm) | Carrier Electron Concentration (cm$^{-3}$) | Carrier Electron Mobility (cm$^3$/Vsec) |
|---|---|---|---|---|---|---|---|
| Ex-38 | 150 | 1.0 | 0.019 | — | $3.5 \times 10^{-4}$ | $2.7 \times 10^{20}$ | 66 |
| Ex-39 | 150 | 1.0 | 0.035 | — | $3.3 \times 10^{-4}$ | $2.9 \times 10^{20}$ | 65 |
| Ex-40 | 150 | 1.0 | 0.050 | — | $3.6 \times 10^{-4}$ | $3.2 \times 10^{20}$ | 54 |
| Ex-41 | 150 | 1.0 | 0.004 | 0.019 | $3.7 \times 10^{-4}$ | $2.8 \times 10^{20}$ | 60 |
| Ex-42 | 150 | 1.0 | 0.006 | 0.024 | $3.5 \times 10^{-4}$ | $3.0 \times 10^{20}$ | 60 |
| Ex-43 | 150 | 1.0 | 0.002 | 0.030 | $4.5 \times 10^{-4}$ | $3.1 \times 10^{20}$ | 45 |
| Ex-44 | 150 | 1.0 | 0.020 | 0.019 | $4.0 \times 10^{-4}$ | $2.8 \times 10^{20}$ | 56 |
| Ex-45 | 150 | 1.0 | 0.012 | 0.024 | $3.8 \times 10^{-4}$ | $2.9 \times 10^{20}$ | 57 |
| Ex-46 | 150 | 1.0 | 0.010 | 0.030 | $4.1 \times 10^{-4}$ | $2.8 \times 10^{20}$ | 54 |
| CE-5 | 150 | 1.0 | — | 0.019 | $5.7 \times 10^{-4}$ | $3.6 \times 10^{20}$ | 30 |
| CE-6 | 150 | 1.0 | — | 0.024 | $5.3 \times 10^{-4}$ | $3.7 \times 10^{20}$ | 32 |
| CE-7 | 150 | 1.0 | — | 0.030 | $5.9 \times 10^{-4}$ | $3.8 \times 10^{20}$ | 28 |

(Ex = Example, CE = Comparative Example)

Electrical Characteristics

It is apparent from FIG. 4 that despite the fact that the indium oxide based transparent oxide electrode films containing titanium according to examples 38 to 40 of the present invention and the indium oxide based transparent oxide electrode films containing titanium and tungsten according to examples 41 to 46 had been deposited by sputtering with the substrate temperature set to a low temperature of 150° C., their electrical resistivity was low at $4.5 \times 10^{-4}$ Ωcm or less. This is because the mobility was high as shown in Table 4.

Crystallinity

Based on X-ray diffraction measurement, the transparent oxide electrode films according to examples 38 through 46 presented similar diffraction patterns to that shown in FIG. 1 for example 6, indicating that the films had the indium oxide bixbyte structure, which has good crystallinity. Furthermore, because no peaks caused by crystal phases other than the indium oxide phase were observed, it was reasoned that the titanium and tungsten had been substituted for the indium in the indium oxide, and had formed a solid solution.

Light Transmittance

Furthermore, the light transmittance of the film itself was high for the infrared light region in addition to the visible light region, and the average light transmittance of the film itself for wavelengths between 1000 nm and 1400 nm was higher than 67%.

Accordingly, the transparent oxide electrode film of the present invention can be manufactured even with the substrate heated to a low temperature of 150° C., and even if such a film is used as the transparent electrode on the light incident side of a solar cell, solar energy in the infrared light region can be utilized effectively.

Furthermore, the electrical characteristics of the indium oxide thin films according to comparative examples 5 to 7 which contain tungsten but not titanium and are manufactured under the same sputtering conditions as examples 31 to 39, are shown in Table 4.

Although the films obtained in comparative examples 5 to 7 had low carrier electron concentration and high transmittance in the infrared light region, their resistivity was higher than the films of examples 38 to 46, at between $5.3 \times 10^{-4}$ Ωcm and $5.9 \times 10^{-4}$ Ωcm. This is due to the fact that the carrier electron mobility between 28 cm$^2$/Vsec and 32 cm/Vsec, is low in comparison with the films of examples 38 to 46. As a result of evaluating the crystallinity of the films based on X-ray diffraction measurement and observation of the film structure using a scanning electron microscope, it was found that because the grain size of the films in examples 38 to 46 is large and the half width of the X-ray diffraction peak is small in comparison with the films according to comparative examples 5 to 7, these films have superior crystallinity to the films according to comparative examples 5 to 7 which are doped only with tungsten. It is assumed that the high carrier electron mobility seen in the films according to examples 38 to 46 is due to their superior crystallinity. Accordingly, both the indium oxide thin film containing titanium and the indium oxide thin film containing tungsten and titanium of the present invention have lower resistance and higher transmittance of visible light and infrared light than conventional indium oxide thin films containing tungsten, even when deposited at a low substrate temperature of 150° C. In the manufacture of transparent oxide electrode films by sputtering, because a shortening of the heating time and a reduction in the electric power used to heat the substrate can be realized by using lower substrate temperatures, manufacturing costs can be reduced, and productivity can be increased. Accordingly, these materials are extremely useful industrially.

When a film was manufactured under the same manufacturing conditions as examples 38 to 46 and comparative examples 5 to 7, except that the substrate temperature was set to 100° C., and a comparison was made of the electrical characteristics and crystallinity, the same tendency was observed. This showed that even at a low substrate temperature such as 100° C., the present invention allows a film with low resistance and high carrier electron mobility and with good light transmittance for both the visible region and the infrared light region to be obtained.

Because the transparent oxide electrode film according to examples 1 to 46 of the present invention allows both visible light and infrared light to pass, using these films as the surface transparent electrode on the light receiving side and/or the transparent electrode behind the p-n junction in a solar cell like that shown in FIG. 6, for example, enables solar energy over a wide wavelength range to be converted effectively to electrical energy.

Comparative Example 8

Using a target prepared under the same manufacturing conditions as example 1, a transparent oxide electrode film with a titanium/indium atomic ratio of 0.130 was obtained under the same conditions as example 1. As a result, this film showed resistivity of between $6.5 \times 10^{-4}$ Ωcm and $7.5 \times 10^{-4}$ Ωcm, and as such a film with resistivity of $5.7 \times 10^{-4}$ Ωcm or less was not realized.

Comparative Example 9

Using a target prepared under the same manufacturing conditions as example 1, a transparent oxide electrode film with a titanium/indium atomic ratio of 0.002 was obtained under the same conditions as example 1. As a result, this film showed resistivity of between $6.0 \times 10^{-4}$ Ωcm and $1.2 \times 10^{-3}$ Ωcm, and as such a film with resistivity of $5.7 \times 10^{-4}$ Ωcm or less was not realized.

Comparative Examples 10 to 13

As comparative examples 10 to 13, films were deposited under different sputtering conditions from examples 38 to 46, using an indium oxide sintered body target containing titanium manufactured according to the same steps as in examples 1 to 12. In comparative example 10, with the substrate temperature set to room temperature, and the oxygen content of the deposition gas at 1%, a film was deposited using an indium oxide sintered body target containing titanium. Furthermore, in comparative example 11, with the substrate temperature set to 60° C., and the oxygen content of the deposition gas at 1%, a film was deposited using an indium oxide sintered body target containing titanium. In addition, in comparative example 12, with the substrate temperature set to 200° C., and the oxygen content of the deposition gas at 0%, a film was deposited using an indium oxide sintered body target containing titanium. In comparative example 13, with the substrate temperature set to 200° C., and the oxygen content of the deposition gas at 0.1%, a film was deposited using an indium oxide sintered body target containing titanium. The films which were deposited onto glass substrates were evaluated using the same evaluation methods as above, and the results are shown in Table 5.

TABLE 5

|  | Substrate Temperature (° C.) | $O_2$ Content of Deposition Gas (%) | Film Ti/In Atomic Ratio | Resistivity ($\Omega$ cm) | Carrier Electron Concentration ($cm^{-3}$) | Carrier Electron Mobility ($cm^2$/Vsec) |
| --- | --- | --- | --- | --- | --- | --- |
| CE-10 | Room Temp. | 1.0 | 0.015 | $1.5 \times 10^{-3}$ | $2.6 \times 10^{20}$ | 16 |
| CE-11 | 60 | 1.0 | 0.015 | $8.0 \times 10^{-4}$ | $5.8 \times 10^{20}$ | 13 |
| CE-12 | 200 | 0 | 0.050 | $8.2 \times 10^{-4}$ | $7.2 \times 10^{20}$ | 11 |
| CE-13 | 200 | 0.1 | 0.050 | $6.2 \times 10^{-4}$ | $1.1 \times 10^{21}$ | 9 |

(CE = Comparative Example)

Although the composition of the films according to comparative examples 10 and 11 is that of indium oxide containing titanium these films were manufactured with the substrate temperature during deposition set to a lower value than that specified in the present invention (at least 100° C.). As shown in Table 5, the resistivity of these films is markedly higher in comparison with the films of the present invention, and as such they are not suitable for use as the transparent electrode in a solar cell. It can be suggested based on Table 5 that the reason for this high resistivity is that both the carrier electron concentration and carrier electron mobility are low in comparison with the films of the present invention. As a result of observing the structure of the films using X-ray diffraction measurement a transmission electron microscopy and electron diffraction analysis, it was apparent that the films according to comparative examples 10 and 11 contain an amorphous phase, and the carrier electron mobility was low as a result of the low crystallinity.

Similar tests were conducted with the substrate made of polyethylene terephthalate film, and substantially the same results were obtained.

Although the composition of the films according to comparative examples 12 and 13 is that of indium oxide containing titanium, these films were manufactured under conditions in which the oxygen content of the sputtering gas during sputtering deposition was lower than the ratio specified in the present invention (at least 0.25%). As shown in Table 5, the resistivity of these films was high in comparison with the films of the present invention. Although the carrier electron concentration of these films was high, the carrier electron mobility was extremely low. Because the carrier electron concentration was high, the infrared ray transmittance is as low as that of ITO films. Accordingly, these films are not suitable for use as the transparent electrode in a solar cell. It is assumed that due to the low oxygen concentration of the sputtering gas, these films have high instances of oxygen deprivation, causing the production of a high concentration of carrier electrons.

Based on these facts, it can be said that crucial to the transparent oxide electrode film of the present invention is not only that the indium oxide contains titanium, but also the substrate temperature during the deposition process and the oxygen content of the sputtering gas.

Manufacturing a Solar Cell

Example 47

Figure 7:
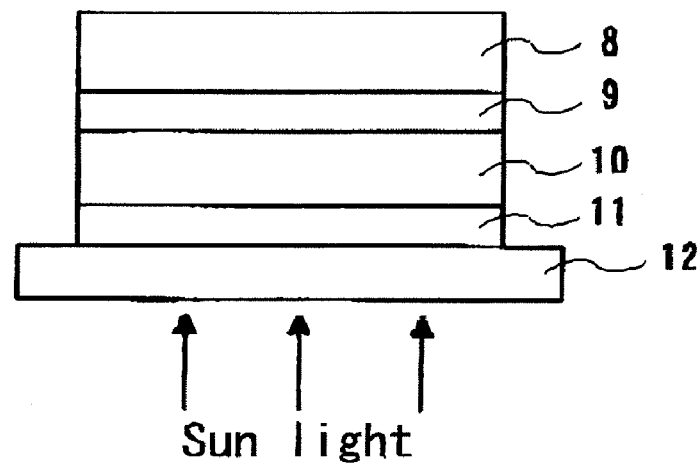
FIG. 7 is an explanatory diagram showing the general structure of the solar cells according to examples 47 to 49 to which the transparent oxide electrode film of the present invention is applied.

An example of the present invention is described below with reference to the drawings. FIG. 7 is a simplified cross sectional view showing a first example of the present invention. An oxide electrode transparent film 11 according to example 5 with a thickness of approximately 500 nm was formed on a glass substrate 12 by a DC magnetron sputtering method under the same deposition conditions as example 5. A ZnO thin film with a thickness of approximately 150 nm as a window layer 10 was then formed thereon by a DC magnetron sputtering method, using a ZnO target, and using argon gas as the sputtering gas. In order to form a hetero p-n junction thereon, a CdS thin film with a thickness of approximately 50 nm as a semiconductor middle layer 9 was formed by means of a solution precipitation method using a mixed solution of $CdI_3$, $NH_4Cl_2$, $NH_3$ and thiourea. A $CuInSe_2$ thin film with a thickness of between 2 µm and 3 µm as a p-type semiconductor light absorbing layer 8 was then formed thereon using a vacuum deposition method. An Au film as rearside electrode 7 with a thickness of approximately 1 µm was then formed thereon using a vacuum deposition method. As a result of irradiating light at 1.5 AM (100 mW/cm$^2$) onto these solar cells from the transparent oxide electrode film side thereof and investigating their characteristics, the conversion efficiency was found to be 12%.

Example 48

A solar cell with the construction shown in FIG. 7 was manufactured following the same steps and using the same methods as example 47, with the exception that the film according to example 15 was used. As a result of examining the characteristics of the solar cell with respect to irradiated light at 1.5 AM (100 mW/cm$^2$) under the same conditions and using the same methods as example 47, the conversion efficiency was found to be 13%.

Example 49

In example 47 and example 48, an example was used in which the characteristics of solar cells were examined using the films of example 5 and example 15, but solar cells manufactured using any film from examples 1 through 46 had similarly high conversion efficiencies, at greater than 11%.

Comparative Example 14

A solar cell with the construction shown in FIG. 7 was manufactured following the same steps and using the same methods as in example 47, with the exception that the ITO film according to comparative example 2 was used, and upon examining the characteristics of this solar cell under the same conditions, it was found that the conversion rate was 5%, which is extremely low in comparison with the solar cells according to examples 47 to 49 of the present invention. Furthermore, when the characteristics were examined in the same manner using an ITO film having the same composition as comparative example 2 manufactured while varying the oxygen content of the sputtering gas during deposition between 0% and 10%, the conversion efficiency was found to be less than 6%.

Comparative Example 15

A solar cell with the construction shown in FIG. 7 was manufactured following the same steps and using the same methods as in example 47, with the exception that the gallium doped zinc oxide film according to comparative example 4 was used as the transparent oxide electrode film, and upon examining the characteristics of the solar cell under the same conditions, the conversion rate was found to be 7%, which is lower than that of the solar cells according to examples 47 to 49 of the present invention. Furthermore, when the characteristics were examined in the same manner using a gallium doped zinc oxide film having the same composition as comparative example 4 manufactured while varying the oxygen content of the sputtering gas during deposition between 0% and 10%, the conversion efficiency was found to be less than 7%, and as such a film with higher conversion efficiency than the examples 47 to 49 of the present invention could not be obtained.

Example 50

A solar cell with the construction shown in FIG. 8 which is an example of the present invention was manufactured in the following manner. An Mo electrode with a thickness of 1 to 2 μm was manufactured on a glass substrate 12 using a DC magnetron sputtering method as a bottom electrode 13. Subsequently, a $CuInSe_2$ thin film with a thickness of 2 to 3 μm was formed in a predetermined region by a vacuum deposition method as a p-type semiconductor light absorbing layer 8. In order to form a hetero p-n junction thereon, a CdS thin film with a thickness of approximately 50 nm was formed by means of a solution precipitation method using a mixed solution of $CdI_2$, $NH_4Cl_2$, $NH_3$ and thiourea, as a semiconductor middle layer 9. A ZnO thin film with a thickness of approximately 150 nm and approximately the same conductivity as the CdS thin film was then formed thereon by means of a DC magnetron sputtering method using a ZnO target and Ar as the sputtering gas, as a window layer 10. In addition, the indium oxide based transparent oxide electrode film 11 containing titanium according to example 39 was formed with a thickness of approximately 500 nm under the same conditions as example 39, using the same DC magnetron sputtering method. As a result of irradiating light at 1.5 AM (100 mW/cm$^2$) onto the glass substrate film side of this solar cell and examining its characteristics, the conversion efficiency was found to be 13%.

Example 51

Figure 8:
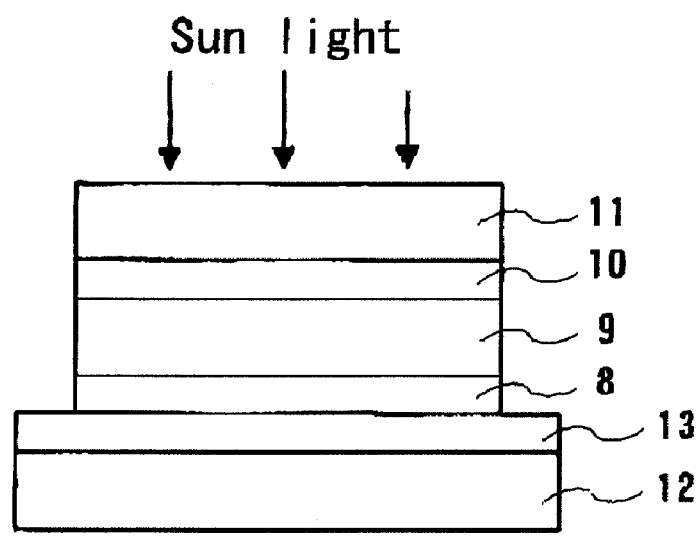
FIG. 8 is an explanatory diagram showing the general structure of the solar cells according to examples 50 to 52 to which the transparent oxide electrode film of the present invention is applied.

A solar cell with the construction shown in FIG. 8 was manufactured following the same steps and using the same methods as in example 50, with the exception that the indium oxide based transparent oxide electrode film containing titanium and tungsten according to example 42 was used as the transparent oxide electrode film, and as a result of examining its characteristics under the same conditions, the conversion efficiency was found to be 12%.

Example 52

In example 50 and example 51, an example was used in which the characteristics of solar cells with the construction shown in FIG. 8 were examined using the films of example 39 and example 42, but solar cells manufactured using any film from examples 38 through 46 had similarly high conversion efficiencies, at greater than 11%.

Comparative Example 16

A solar cell with the construction shown in FIG. 8 was manufactured following the same steps and using the same methods as in example 50, with the exception that the ITO film according to comparative example 3 was used, and upon examining the characteristics of this solar cell under the same conditions, it was found that the conversion rate was 6%, which is extremely low in comparison with the solar cells according to examples 50 to 52 of the present invention. Furthermore, when the characteristics were examined in the same manner using an ITO film having the same composition as comparative example 3 manufactured while varying the oxygen content of the sputtering gas during deposition between 0% and 10%, the conversion efficiency was found to be less than 6%.

Comparative Example 17

A solar cell with the construction shown in FIG. 8 was manufactured following the same steps and using the same methods as in example 50, with the exception that the gallium doped zinc oxide film according to comparative example 4 was used as the transparent oxide electrode film, and upon examining the characteristics of the solar cell under the same conditions, the conversion rate was found to be 8%, which is lower than that of the solar cells according to examples 50 to 52 of the present invention. Furthermore, when the characteristics were examined in the same manner using a gallium doped zinc oxide film having the same composition as comparative example 4 with the oxygen content of the sputtering gas during deposition varied between 0% and 10%, the conversion efficiency was found to be less than 7%, and as such a film with higher conversion efficiency than the examples 50 to 52 of the present invention could not be obtained.

In examples 47 through 52, examples of solar cells using $CuInSe_2$ thin films as the light absorbing layer were used, but the results are the same if $CuInS_2$, $CuGaSe_3$, $Cu(In, Ga)Se_2$ and CdTe thin films are used as the light absorbing layer, and it was found that using the transparent oxide electrode film of the present invention enables the manufacture of a solar cell with a conversion efficiency clearly higher than if a conventional transparent oxide electrode film were used.

As described above, the characteristics of the solar cells obtained according to the present invention are far superior to the characteristics of the solar cells obtained according to a conventional structure. This is thought to be because the high transmittance for both visible light and infrared light of the transparent oxide electrode film of the present invention allows solar energy to be converted to electrical energy highly effectively.

Manufacturing a Photo Detection Element

Example 53 and Comparative Example 18

Figure 9:
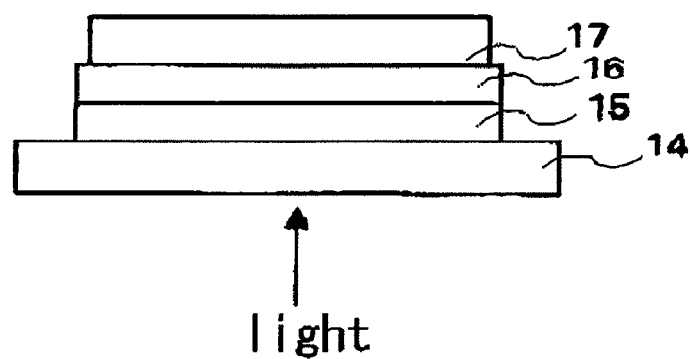
FIG. 9 is an explanatory diagram showing the general structure of the photo detection elements according to example 53 to which the transparent oxide electrode film of the present invention is applied.

The example of manufacturing a photo detection element with using Eu and Sm doped CaS materials as photo detection materials is described hereinafter. FIG. 9 is a simplified cross sectional view showing a structure of the photo detection element according to the example 53 of the present invention. A titanium doped indium oxide thin film or a titanium and tungsten doped indium oxide thin film 15 according to example 5 with a thickness of approximately 200 nm as a transparent electrode on the light incident side was formed on a glass substrate 14 by a sputtering method. A photo detection materials layer 16 of Eu and Sm doped CaS with a thickness of approximately 1 μm was then formed thereon using a sintered body pellet of CaS with 200 ppm of $Eu_2O_3$ and $Sm_2O_3$ added to it, by an electron beam vapour deposition method and with the substrate heated to 500° C. An aluminum film 17 as a rear electrode was then formed on the photo detection material layer by a sputtering method.

Moreover, as comparative example 18, a photo detection element was manufactured following the same steps, the same conditions, the same size and using the same method as in example 53, with the exception that the ITO film according to comparative examples 1 to 3 with a thickness of 200 nm was formed for the electrode on the light incident side.

As a result of irradiating infrared light with a constant wavelength and a constant intensity onto these photo detection elements and measuring and comparing their change of electric capacity between the transparent electrode and the rear electrode, the change of electric capacity of the photo detection element according to example 53 is larger than the change of electric capacity of the photo detection element according to comparative example 18, and it was found that the sensitivity to the infrared ray of the photo detection element according to the present invention is excellent.

As described above, it was confirmed that the characteristics of the photo detection element obtained according, to the present invention were far superior to the characteristics of the photo detection element using a conventional ITO film. This is thought to be because the high transmittance for not only visible light but also infrared light of the transparent oxide electrode film of the present invention allows solar energy to be converted to electrical energy highly effectively. While the example 53 used the transparent oxide electrode film according to example 5, the same result could be obtained in case of using the transparent oxide electrode film according to examples from 1 to 4 and from 6 to 37. In other words, the transparent oxide electrode film of the present invention has the high transmittance for not only infrared light but also visible light so that a photo detection element for visible light can be realized when the transparent oxide electrode film of the present invention applies to a photo detection element for visible light. Moreover, in case of the photo detection element using an avalanche photodiode or a photodiode as the layer of photo detection materials, the sensitivity to the infrared light can be also improved with using the transparent oxide electrode film of the present invention as an electrode on the incident side infrared light carries out.

As described in detail above, according to the present invention, it is possible to provide a transparent oxide electrode film which has excellent transmittance for both the visible light region and the infrared light region, and also has low resistivity. Furthermore, because the transparent oxide electrode film of the present invention can be manufactured by sputtering deposition at low substrate temperatures of 100 to 150° C., manufacturing costs can be reduced and productivity can be increased, and this invention is therefore extremely useful industrially. By using the transparent oxide electrode film of the present invention as the transparent electrode on the light incident side of a variety of solar cells, it is possible to make highly efficient use of solar energy in the infrared light region, which was not possible conventionally.

Furthermore, the photo detection element using the transparent oxide electrode film of the present invention as an electrode on the light incident side can detect weaker infrared light and has the high sensitivity in comparison with the photo detection element for infrared light having the same structure and using a conventional ITO film so that it is therefore possible to provide a photo detection element extremely useful in the field of the optical communication in particular.

What is claimed is:

1. A transparent oxide electrode film having indium oxide containing titanium and tungsten as its main component, wherein indium in said indium oxide is substituted with titanium and tungsten at a ratio which when the titanium/indium atomic ratio is deemed x and the tungsten/indium atomic ratio is deemed y, satisfies an equation (1), $0.019-1.90x \leq y \leq 0.034-0.28x$ (1) and wherein said indium oxide is crystalline, and the resistivity is up to $5.7 \times 10^{-4}$ Ωcm.

2. A transparent oxide electrode film according to claim 1, wherein when the titanium/indium atomic ratio is deemed x and the tungsten/indium atomic ratio is deemed y, said ratio satisfies an equation (2) $0.019-1.27x \leq y \leq 0.034-0.68x$ (2) and wherein said resistivity is up to $3.8 \times 10^{-4}$ Ωcm.

3. A transparent oxide electrode film according to claim 1, wherein the average light transmittance for wavelengths between 1000 nm and 1400 nm is at least 60%.

4. A transparent oxide electrode film according to claim 1, wherein the carrier electron concentration given by Hall effect measurement is up to $5.5 \times 10^{20}$ $cm^{-3}$.

5. A transparent oxide electrode film according to claim 4, wherein the carrier electron concentration given by Hall effect measurement is up to $4.0 \times 10^{20}$ $cm^{-3}$.

6. A transparent oxide electrode film according to claim 1, wherein the carrier electron mobility given by Hall effect measurement is at least 40 $cm^2$/Vsec.

7. A transparent oxide electrode film according to claim 6, wherein the carrier electron mobility given by Hall effect measurement is at least 60 $cm^2$/Vsec.

8. A transparent oxide electrode film according to claim 7, wherein the carrier electron mobility given by Hall effect measurement is at least 70 $cm^2$/Vsec.

* * * * *